United States Patent
Wang et al.

(10) Patent No.: US 8,222,801 B2
(45) Date of Patent: Jul. 17, 2012

(54) LAMP AND LAMP HOLDER MODULE THEREOF

(75) Inventors: Yan-Yu Wang, Taipei (TW); Chen-Yu Chen, Taipei (TW); Chih-Lung Liang, Taipei (TW); Shun-Chung Cheng, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 211 days.

(21) Appl. No.: 12/821,472

(22) Filed: Jun. 23, 2010

(65) Prior Publication Data

US 2011/0156567 A1 Jun. 30, 2011

(30) Foreign Application Priority Data

Dec. 28, 2009 (CN) .......................... 2009 1 0265434

(51) Int. Cl.
*H01L 23/34* (2006.01)
(52) U.S. Cl. ...................... 313/46; 362/249.11; 362/647; 362/651; 362/652; 313/331; 313/49; 313/318.01; 313/51

(58) Field of Classification Search .................. 313/356, 313/331, 333, 318.01–318.12, 49–51, 281, 313/292, 42, 512, 580, 624–626, 324, 17, 313/20, 33, 46, 45; 362/221, 224, 480, 546, 362/547, 218, 294, 373, 555, 235, 249.01, 362/249.02, 640, 646, 647, 651, 249.11, 362/382, 652; 439/487; 257/81
See application file for complete search history.

(56) References Cited

U.S. PATENT DOCUMENTS

2009/0242922 A1* 10/2009 Lin ................................ 257/99
* cited by examiner

*Primary Examiner* — Joseph L Williams
*Assistant Examiner* — Fatima Farokhrooz
(74) *Attorney, Agent, or Firm* — Rosenberg, Klein & Lee

(57) ABSTRACT

A lamp includes a lamp holder module and light-emitting module disposed in the lamp holder module. The lamp holder module includes a body, a pressing mechanism disposed on the body, and an upper cover engaging removably the body. The light-emitting module is placed on the body and is pressed into position through the pressing mechanism. The pressing mechanism is operable to release the light-emitting module, thereby facilitating removal and installation of the light-emitting module. The upper cover serves as a lens of the light-emitting module and covers the light-emitting module.

20 Claims, 4 Drawing Sheets

LAMP AND LAMP HOLDER MODULE THEREOF

CROSS-REFERENCE TO RELATED APPLICATION

This application claims priority of Chinese Patent Application No. 200910265434.3, filed on Dec. 28, 2009.

BACKGROUND OF THE INVENTION

1. Field of the Invention

The invention relates to a lamp and a lamp holder, more particularly to a lamp having a light source that is easily removed or installed, and a lamp holder of the lamp.

2. Description of the Related Art

Taiwanese Utility Model No. M343110 discloses a conventional light-emitting diode lamp, wherein a light-emitting diode is disposed in a lamp housing and a circuit board provided with a circuit unit is disposed in a sealed hood coupled to a lower portion of the lamp housing. The light-emitting diode and the circuit board are coupled electrically via soldering wires. Therefore, when a light-emitting chip of the light-emitting diode is damaged, it is difficult to remove the light-emitting diode independently for repair or replacement. Sometimes, the whole lamp is replaced. As such, the replacement and maintenance costs are relatively high, and other functioning components are wasted.

SUMMARY OF THE INVENTION

Therefore, an object of the present invention is to provide a lamp that permits removal or installation of a light-emitting diode, and a lamp holder module of the lamp.

Accordingly, the lamp of this invention includes a light-emitting module and a lamp holder module. The lamp holder module permits the light-emitting module to be removably disposed therein so that the light-emitting module can be removed from or installed in the lamp holder module independently.

The light-emitting module includes a substrate and at least one light-emitting chip disposed on the substrate. The substrate has a first electrode contact and a second electrode contact which are coupled electrically to the light-emitting chip. The lamp holder module includes a body for placement of the light-emitting module, and a pressing mechanism. The pressing mechanism has a pressing member and an actuating member. The pressing member has a pressing portion for pressing the substrate, and a first electrode contact portion and a second electrode contact portion which are connected to the pressing portion. The first electrode contact portion and the second electrode contact portion are disposed to contact the first electrode contact and the second electrode contact, respectively. The actuating member is connected pivotably to the body, and has a first end connected to the pressing member, and a second end exposed from the body. The second end is operable to drive the pressing portion to move relative to the substrate.

The effect of this invention resides in that, by virtue of the configuration of the pressing mechanism, the light-emitting module can be pressed into position by the pressing member, so that, when the light-emitting module is damaged, a user may remove the light-emitting module independently for repair or replacement, and does not need to dispose of the other functioning components. This not only can reduce maintenance and replacement costs, waste of functioning components can also be avoided.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
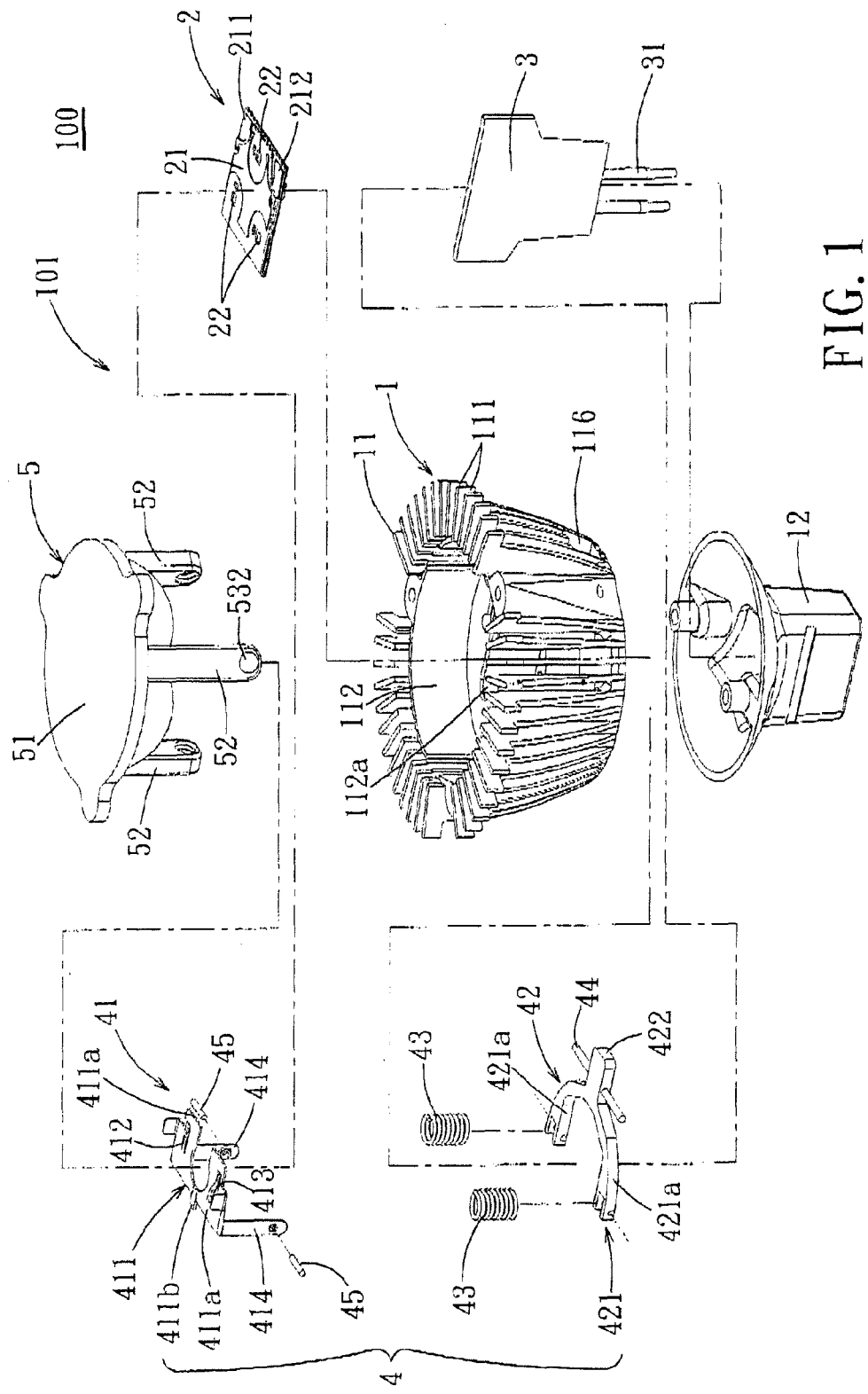
FIG. 1 is an exploded perspective view of the preferred embodiment of a lamp according to the present invention.

FIG. 1 is an exploded perspective view of the preferred embodiment of a lamp 100 according to the present invention. The lamp 100 includes a lamp holder module 101, a light-emitting module 2 disposed on the lamp holder module 101, and a circuit unit 3.

The light-emitting module 2 includes a substrate 21 and a plurality of light-emitting chips 22 disposed fixedly on the substrate 21. Certainly, the number of the light-emitting chips 22 is not limited to what is disclosed herein. The light-emitting module 2 may include only one light-emitting chip 22, depending on the required luminosity. The substrate 21 may be a circuit board or a ceramic substrate, and has a first electrode contact 211 and a second electrode contact 212 which are coupled electrically to the light-emitting chips 22. In this embodiment, the first electrode contact 211 and the second electrode contact 212 are both exposed from a top face of the substrate 21.

The lamp holder module 101 includes a body 1, a pressing mechanism 4 disposed within the body 1, and an upper cover 5. The body 1 includes a top casing 11 and a bottom casing 12. In this embodiment, the top casing 11 of the body 1 has a periphery formed with a plurality of heat dissipating fins 111 so that the top casing 11 as a whole has the appearance and structure of a heat sink. The bottom casing 12 is coupled to a lower portion of the top casing 11 and is substantially hollow. The circuit unit 3 is disposed within the bottom casing 12, and has wires 31 extending through a lower portion of the bottom casing 12 to be connected electrically to an external power source.

Figure 2:
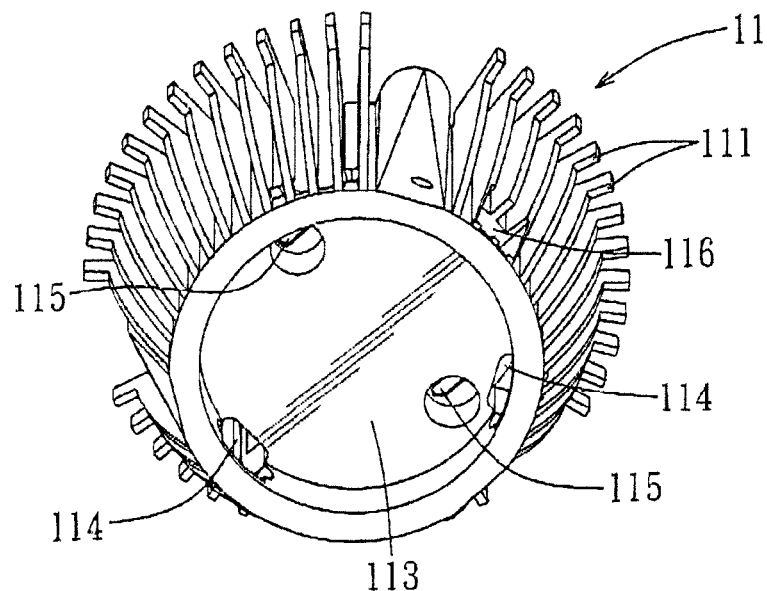
FIG. 2 is a bottom perspective view of a top casing of a body of the preferred embodiment.
Figure 3:
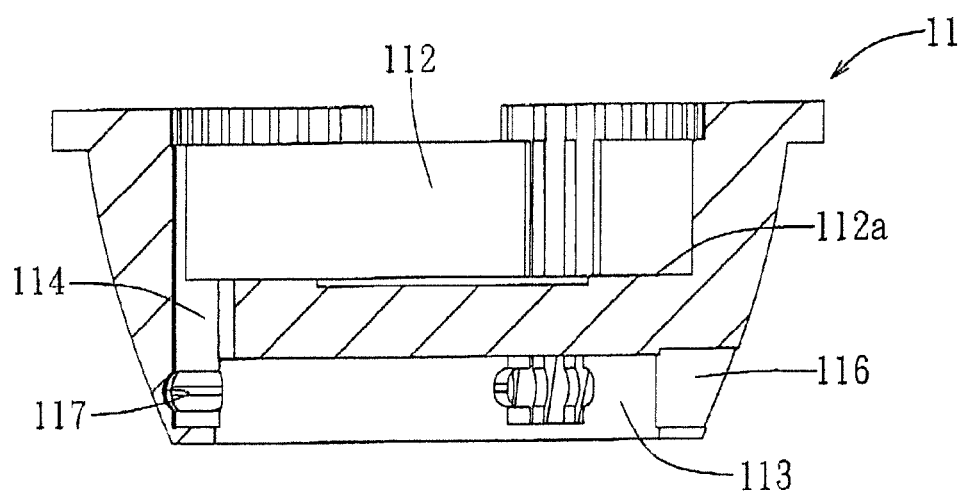
FIG. 3 is a sectional view of the top casing of the preferred embodiment.

Referring to FIGS. 2 and 3, the top casing 11 of the body 1 is further formed with a first recess 112 that extends downwardly, a second recess 113 disposed below the first recess 112, a plurality of slots 114 extending further downward from the first recess 112, and a plurality of through holes 115 intercommunicating the first recess 112 and the second recess 113. In addition, one side of the top casing 11 is provided with a lateral opening 116 in spatial communication with the second recess 113. An inner wall surface of the top casing 11 of the body 1 is laterally dented to form a lateral groove 117 at each of the slots 114. The first recess 112 has an inner bottom face (112*a*). The substrate 21 of the light-emitting module 2 is disposed on the inner bottom face (112*a*) with the light-emitting chips 22 facing upwardly (see FIG. 1). In this embodiment, the second recess 113 extends upwardly from a bottom side of the top casing 11 so as to be opposite to the first recess 112.

Figure 4:
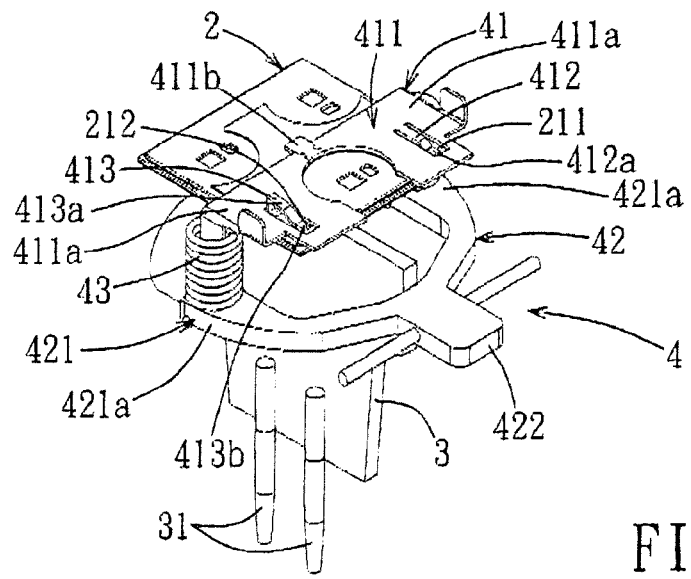
FIG. 4 is a perspective view showing how a pressing mechanism and a light-emitting module of the preferred embodiment are coupled.
Figure 5:
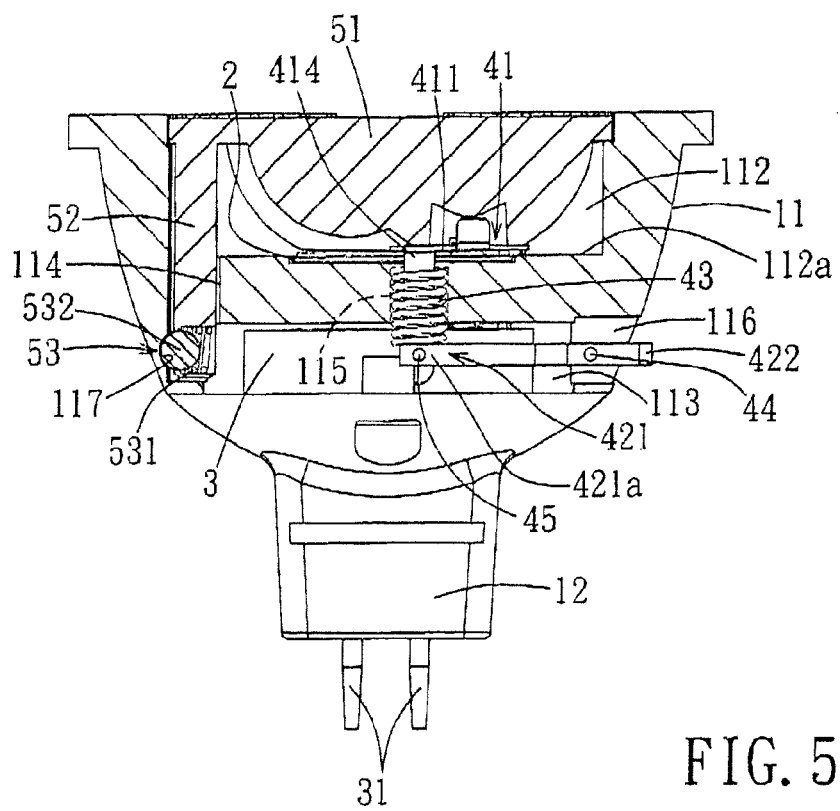
FIG. 5 is a fragmentary sectional view of the preferred embodiment.

Referring to FIGS. 1, 4 and 5, the pressing mechanism 4 includes a pressing member 41, an actuating member 42, at least one biasing member 43, a first pivot 44, and two second pivots 45.

Specifically, the pressing member 41 has a pressing portion 411, a first electrode contact portion 412 and a second electrode contact portion 413 connected to the pressing portion 411, and two connecting sections 414 connected to the pressing portion 411. The pressing portion 411 includes two conductive pieces (411*a*) formed from an electrically conductive material, and an insulating section (411*b*) interconnecting the conductive pieces (411*a*). The first electrode contact portion 412 and the second electrode contact portion 413 are coupled respectively to the conductive pieces (411*a*). In this embodiment, each of the first electrode contact portion 412 and the second electrode contact portion 413 is formed by punching a part of a respective one of the conductive pieces (411*a*) into a terminal-like structure. In this embodiment, the first electrode contact portion 412 has a distal end (412*a*) disposed at a position lower than a bottom face of the corresponding one of the conductive pieces (411*a*), and the second electrode contact portion 413 has a distal end (413*b*) disposed at a position higher than a bottom face of the corresponding one of the conductive pieces (411*a*). Moreover, the second electrode contact portion 413 has an upwardly bulging segment (413*a*). The functionality of the configurations of the first and second electrode contact portions 412, 413 will be described in detail hereinafter.

The two connecting sections 414 extend downwardly and respectively from the conductive pieces (411*a*) of the pressing portion 411, and have an elongate shape. The two connecting sections 414 of the pressing member 41 extend downwardly and respectively through the two through holes 115 (see FIG. 2) in the top casing 11 of the body 1 into the second recess 113 such that the pressing portion 411 is located above the inner bottom face (112*a*) of the first recess 112. The connecting sections 414 extending into the second recess 113 may be connected to the circuit unit 3 through additional soldering wires (not shown).

The actuating member 42 has a first end 421 connected to the pressing member 41, and a second end 422 extending outwardly of the body 1 to permit operation or manipulation thereof. In this embodiment, a portion of the actuating member 42 between the first and second ends 421, 422 is pivoted to the top casing 11 of the body 1 by means of the first pivot 44. The first end 421 of the actuating member 42 is bifurcated and is formed with two branched sections (421*a*), each of which has a forked distal end. The two branched sections (421*a*) are disposed within the second recess 113, and the forked distal ends thereof are respectively registered with and disposed below the two through holes 115 in the top casing 11 for extension of the two connecting sections 414 into the forked distal ends, respectively. Each of the branched sections (421*a*) is pivoted to the respective connecting section 414 by one of the second pivots 45 that extends therethrough. The second end 422 of the actuating member 42 extends transversely and outwardly of the top casing 11 of the body 1 through the lateral opening 116.

The two biasing members 43 in this embodiment are compression springs, each of which is sleeved on a respective one of the connecting sections 414 of the pressing members 41, and has a top end disposed within a respective one of the through holes 115, and a bottom end abutting against a respective one of the branched sections (421*a*) of the first end 421 of the actuating member 42. By virtue of the biasing action of the biasing members 43, the pressing portion 411 of the pressing member 41 is normally biased against the inner bottom face (112*a*) of the top casing 11 of the body 1. Therefore, when the light-emitting module 2 is placed on the inner bottom face (112*a*) of the top casing 11 of the body 1, the biasing members 43 will bias the pressing portion 411 of the pressing member 41 against the substrate 21 of the light-emitting module 2. Since, as mentioned hereinbefore, the distal end (412*a*) of the first electrode contact portion 412 is lower than the bottom face of the corresponding one of the conductive pieces (411*a*), and the distal end (413*b*) of the second electrode contact portion 413 is higher than the bottom face of the corresponding one of the conductive pieces (411*a*), the distal end (412*a*) of the first electrode contact portion 412 of the pressing member 41 will contact the first electrode contact 211 of the substrate 21, and the distal end (413*b*) of the second electrode contact portion 413 of the pressing member 41 will be located above the second electrode contact 212 of the substrate 21 so that there is no contact between the distal end (413*b*) of the second electrode contact portion 413 and the second electrode contact 212. Thus, although the light-emitting module 2 is pressed and positioned against the inner bottom face (112*a*), there is no electrical connection between the light-emitting module 2 and the circuit unit 3.

Figure 6:
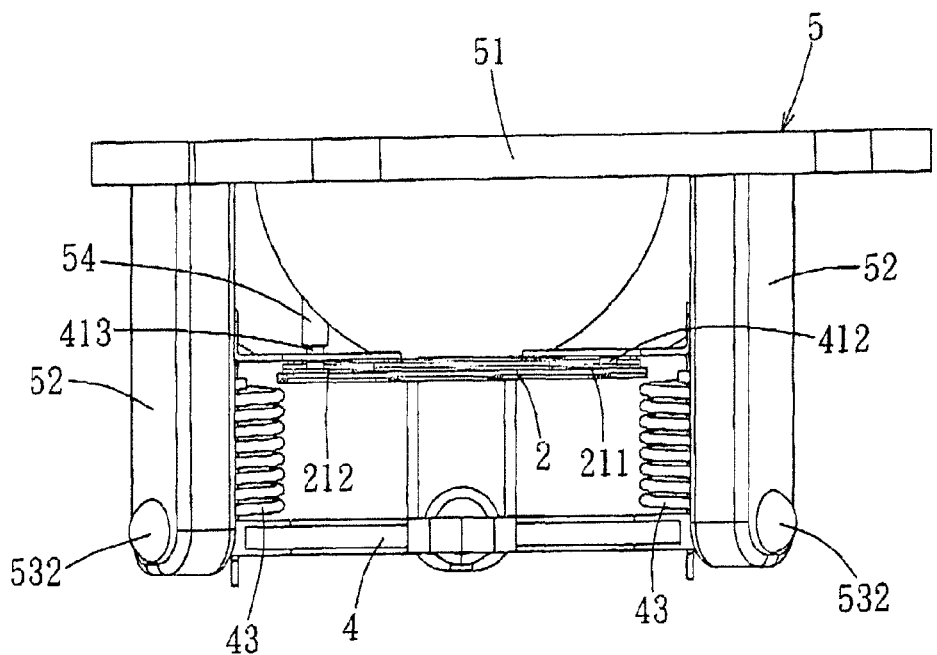
FIG. 6 is an assembled front view of a cover, an actuating member, and the light-emitting module of the preferred embodiment.
Figure 7:
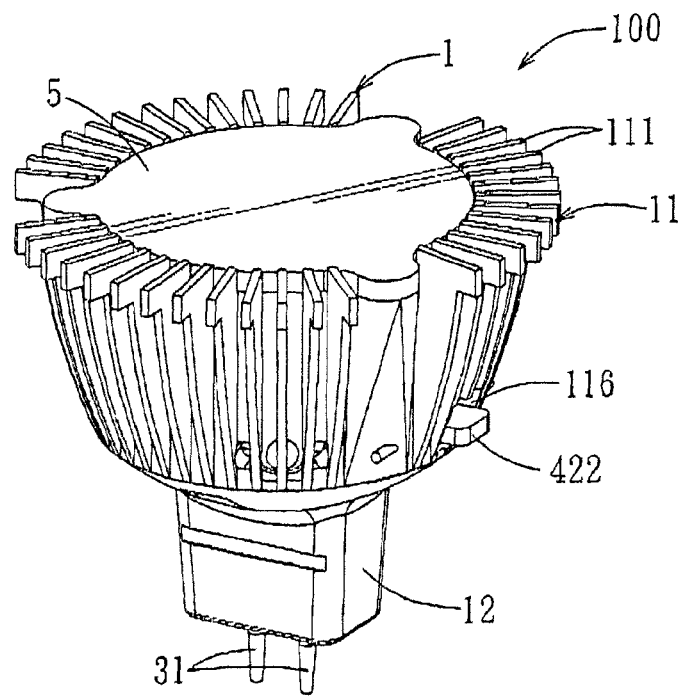
FIG. 7 is an assembled perspective view of the preferred embodiment.

Referring to FIGS. 1, 5 and 7, the upper cover 5 includes a lens portion 51, a plurality of extension sections 52 extending downwardly from the lens portion 51, and a post 54 (see FIG. 6) extending downwardly from a bottom face of the lens portion 51. The upper cover 5 is coupled to the top casing 11 of the body 1 through the extension sections 52 that are inserted respectively into the slots 114. At this point, the lens portion 51 is disposed in the first recess 112 of the top casing 11 and covers the light-emitting module 2. The position of the post 54 is configured such that, when the extension sections 52 are inserted respectively into the slots 114 to enable the lens portion 51 to cover the light-emitting module 2, the post 54 can depress the upwardly bulging segment (413*a*) of the second electrode contact portion 413 to enable the distal end (413*b*) of the second electrode contact portion 413 to move downwardly to come into contact with the second electrode contact 212, thereby establishing an electrical connection between the light-emitting chips 22 of the light-emitting module 2 and the circuit unit 3.

Therefore, it can be appreciated from the foregoing that, due to the structural cooperation between the light-emitting module 2 and the upper cover 5, the light-emitting module 2 will be pressed and electrically connected only when the upper cover 5 is assembled to the body 1. Hence, undesirable situations in which a user may experience an electric shock when installing or removing the light-emitting module 2 can be avoided to enhance safety when installing or removing the light-emitting module 2.

It is particularly noted that, to enhance the stability of engagement between the upper cover 5 and the top casing 11 of the body 1, the upper cover 5 in this embodiment further includes a plurality of resilient protrusions 53 that are disposed respectively on the extension sections 52 adjacent to distal ends of the same, and that protrude resiliently and laterally. In this embodiment, each of the resilient protrusions 53 may include a spring 531 disposed transversely within the respective extension section 52, and a ball 532 abutting against one end of the spring 531 and having a part exposed from an outer side of the respective extension section 52. When the extension sections 52 are respectively inserted into the slots 114, parts of the balls 532 that are exposed from the extension sections 52 extend respectively into the lateral grooves 117 to result in a retaining effect so that the upper cover 5 will not easily separate from the body 1 in an upward direction. When the user desires to remove the upper cover 5, the user just needs to pull the upper cover 5 upwardly so that each of the balls 532 is pushed by an inner wall defining the respective slot 114, and withdraws into the respective extension section 52 to thereby release the engagement between each of the balls 532 and the respective lateral groove 117. The upper cover 5 can then be lifted smoothly. Certainly, in other embodiments, there may be provided only one or more extension sections 52 and only one or more resilient protrusions 53.

When the user intends to remove the light-emitting module 2 from the lamp holder module 101 or to install the light-emitting module 2 into the lamp holder module 101, the upper cover 5 is first lifted, and the second end 422 of the actuating member 42 is subsequently depressed so that the first end 421 of the actuating member 42 pushes the pressing member 41 associated therewith to cause the pressing portion 411 to be pushed upwardly away from the inner bottom face (112a) to lengthen a distance between the pressing portion 411 and the inner bottom face (112a) so as to permit the light-emitting module 2 to be removed from or placed on the inner bottom face (112a). After the light-emitting module 2 is placed in position, the second end 422 of the actuating member 42 can be released, so that the pressing portion 411 is once again biased against the light-emitting module 2 by the released resilient forces of the biasing members 43. Finally, the upper cover 5 is put back in place on the top casing 11 of the body 1 to complete the removal or installation of the light-emitting module 2.

With the above-described construction of the present invention, the light-emitting module 2 can be removed from or installed in the lamp holder module 101 independently, which not only reduces maintenance and replacement costs of the lamp 100, other functioning components of the lamp 100 do not have to be wasted.

It is additionally noted that, in a modified embodiment of the pressing member 41, the first electrode contact portion 412 can be configured to have the same structure as the second electrode contact portion 413 (i.e., the distal ends (412a, 413b) of the first and second electrode contact portions 412, 413 are both higher than the bottom face of the respective conductive pieces (411a)), so that, when the light-emitting module 2 is pressed against the pressing portion 411 thereabove, the distal ends (412a, 413b) of the first electrode contact portion 412 and the second electrode contact portion 413 will not contact the first electrode contact 211 and the second electrode contact 212. Only when the upper cover 5 is put in place will the distal ends (412a, 413b) of the first electrode contact portion 412 and the second electrode contact portion 413 come into contact with the first electrode contact 211 and the second electrode contact 212. In this case, the bottom face of the lens portion 51 of the upper cover 5 therefore has a corresponding protruding structure for pressing both the first electrode contact portion 412 and the second electrode contact portion 413 simultaneously.

Moreover, in another modified embodiment of the pressing member 41, the second electrode contact portion 413 can be configured to have the same structure as the first electrode contact portion 412 (i.e., the distal ends (412a, 413b) of the first and second electrode contact portions 412, 413 are both lower than the bottom face of the respective conductive pieces (411a)). In other words, when the light-emitting module 2 is pressed against the pressing portion 411 thereabove, the distal ends (412a, 413b) of the first electrode contact portion 412 and the second electrode contact portion 413 will contact the first electrode contact 211 and the second electrode contact 212, respectively.

While the present invention has been described in connection with what is considered the most practical and preferred embodiment, it is understood that this invention is not limited to the disclosed embodiment but is intended to upper cover various arrangements included within the spirit and scope of the broadest interpretation so as to encompass all such modifications and equivalent arrangements.

What is claimed is:

1. A lamp comprising:
   a light-emitting module including a substrate and at least one light-emitting chip disposed on said substrate, said substrate having a first electrode contact and a second electrode contact which are coupled electrically to said light-emitting chip; and
   a lamp holder module including
      a body for placement of said light-emitting module, and
      a pressing mechanism including
         a pressing member having a pressing portion for pressing said substrate, and a first electrode contact portion and a second electrode contact portion coupled to said pressing portion, said first electrode contact portion and said second electrode contact portion being disposed to contact said first electrode contact and said second electrode contact, respectively, and
         an actuating member connected pivotably to said body and having a first end connected to said pressing member, and a second end exposed from said body, said second end being operable to drive said pressing portion to move relative to said substrate.

2. The lamp of claim 1, wherein said body includes a top casing and a bottom casing, said top casing being dented downwardly to form a first recess, said first recess having an inner bottom face, said light-emitting module being disposed on said inner bottom face of said first recess.

3. The lamp of claim 1, further comprising a circuit unit, said circuit unit being disposed in said body to be coupled electrically to said first electrode contact portion and said second electrode contact portion.

4. The lamp of claim 2, wherein said pressing mechanism further includes at least one biasing member abutting against and disposed between said top casing of said body and said first end of said actuating member, said biasing member providing a biasing action to normally bias said pressing portion against said substrate of said light-emitting module.

5. The lamp of claim 2, wherein said top casing of said body has a periphery formed with a plurality of heat dissipating fins.

6. The lamp of claim 2, wherein said top casing of said body is further formed with a second recess disposed under said first recess, and a lateral opening in spatial communication with said second recess, said first end of said actuating member being disposed in said second recess, said second end of said actuating member being exposed from said body through said lateral opening.

7. The lamp of claim 2, wherein said lamp holder module further includes an upper cover engaging removably said body and covering said light-emitting module.

8. The lamp of claim 6, wherein said pressing portion includes two conductive pieces and an insulating sect ion interconnecting said conductive pieces, said first and second electrode contact portions being connected respectively to said conductive pieces.

9. The lamp of claim 8, wherein said pressing mechanism further includes a first pivot and two second pivots, said actuating member being disposed pivotably in said top casing through said first pivot, said pressing mechanism further including two connecting sections extending downwardly and respectively from said conductive pieces, said top casing of said body being further formed with two through holes intercommunicating said first recess and said second recess, said two connecting sections of said pressing member extending downwardly into said second recess through said through holes, respectively, said first end of said actuating member being bifurcated to form two branched sections, each of which is connected pivotably to a respective one of said connecting sections via a respective one of said second pivots, said connecting sections being for coupling electrically to a circuit unit.

10. The lamp of claim 9, wherein said first electrode contact portion is connected and integrally formed with the respective one of said conductive pieces and the respective one of said connecting sections, and said second electrode contact portion is connected to and integrally formed with the respective one of said conductive pieces and the respective one of said connecting sections.

11. The lamp of claim 10, wherein said pressing mechanism further includes two biasing members which are compression springs, said compression springs being sleeved respectively on said connecting sections and having top ends disposed respectively in said through holes, and bottom ends respectively abutting against said branched sections of said actuating member.

12. The lamp of claim 7, wherein said upper cover includes a lens portion and an extension section connected to said lens portion and extending downwardly, said top casing of said body being further dented to form a slot, said extension section of said upper cover extending into said slot such that said lens portion covers said light-emitting module.

13. The lamp of claim 7, wherein said upper cover includes a post for abutting against said second electrode contact portion to bring said second electrode contact portion into contact with said second electrode contact.

14. The lamp of claim 12, wherein said upper cover further includes a resilient protrusion disposed on said extension section and protruding resiliently and laterally, said top casing of said body being further dented laterally at said slot to form a lateral groove, said resilient protrusion engaging said lateral groove when said extension section is inserted into said slot.

15. The lamp of claim 12, wherein said second electrode contact portion includes an upwardly bulging segment, and a distal end disposed at a position higher than a bottom face of said pressing portion, said lens portion having a bottom abutting against said upwardly bulging segment of said second electrode contact portion and pressing said second electrode contact portion into contact with said second electrode contact when said upper cover engages said body.

16. The lamp of claim 14, wherein said resilient protrusion includes a spring disposed transversely in said extension section, and a ball, said ball having a part abutting against said spring and another part protruding resiliently and outwardly of said extension section in a lateral direction.

17. A lamp holder module for holding a substrate having a light-emitting chip therein, the substrate having a first electrode contact and a second electrode contact which are coupled electrically to the light-emitting chip, said lamp holder module comprising:
a body for placement of the substrate; and
a pressing mechanism including
a pressing member having a pressing portion for pressing the substrate, and a first electrode contact portion and a second electrode contact portion which are coupled to said pressing portion, said first electrode contact portion and said second electrode contact portion being disposed to contact the first electrode contact and the second electrode contact, respectively, and
an actuating member connected pivotably to said body and having a first end connected to said pressing member, and a second end exposed from said body, said second end being operable to drive said pressing portion to move relative to the substrate.

18. The lamp holder module of claim 17, wherein said body includes a top casing and a bottom casing, said top casing being dented downwardly to form a first recess, said first recess having an inner bottom face, said inner bottom face of said first recess being configured for placement of the substrate.

19. The lamp holder module of claim 18, wherein said pressing mechanism further includes at least one biasing member abutting against and disposed between said top casing of said body and said first end of said actuating member, said biasing member providing a biasing action to normally bias said pressing portion against the substrate.

20. The lamp holder module of claim 18, further comprising an upper cover engaging removably said body for covering the light-emitting chip, said upper cover including a lens portion and an extension section connected to said lens portion and extending downwardly, said top casing of said body being further dented to form a slot, said extension section of said upper cover extending into said slot such that said lens portion covers the light-emitting chip.

* * * * *